US012656960B2

(12) United States Patent
Lu

(10) Patent No.: US 12,656,960 B2
(45) Date of Patent: Jun. 16, 2026

(54) POWER-EFFICIENT MONITORING FOR USAGE-BASED-DISTURBANCE MITIGATION

(71) Applicant: Micron Technology, Inc., Boise, ID (US)

(72) Inventor: Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/785,945

(22) Filed: Jul. 26, 2024

(65) Prior Publication Data

US 2026/0029925 A1    Jan. 29, 2026

(51) Int. Cl.
    *G06F 12/00*        (2006.01)
    *G06F 3/06*         (2006.01)
    *G11C 11/406*       (2006.01)
(52) U.S. Cl.
    CPC .......... *G06F 3/0619* (2013.01); *G06F 3/0659* (2013.01); *G06F 3/0673* (2013.01); *G11C 11/406* (2013.01)
(58) Field of Classification Search
    CPC ............................. G11C 14/0018; G06F 3/061
    USPC ......................................................... 711/105
    See application file for complete search history.

(56) References Cited

U.S. PATENT DOCUMENTS

| | | | | |
|---|---|---|---|---|
| 2005/0071102 A1* | 3/2005 | Shimizu | ............. | G01R 31/2803 |
| | | | | 382/145 |
| 2009/0089485 A1* | 4/2009 | Yeh | ..................... | G06F 12/0246 |
| | | | | 711/159 |
| 2015/0200002 A1* | 7/2015 | Lin | ................... | G11C 11/40618 |
| | | | | 711/106 |
| 2015/0378924 A1* | 12/2015 | Brandt | ................ | G06F 12/0891 |
| | | | | 711/133 |
| 2021/0351788 A1* | 11/2021 | Jun | ........................ | H03M 7/405 |
| 2022/0091784 A1* | 3/2022 | Brandl | .................. | G06F 3/0673 |
| 2023/0195337 A1* | 6/2023 | Del Gatto | ............... | G06F 3/061 |
| | | | | 711/154 |
| 2023/0236739 A1* | 7/2023 | Gieske | .................. | G06F 3/0673 |
| | | | | 711/105 |
| 2023/0236982 A1* | 7/2023 | Thirumala | .......... | G11C 11/4063 |
| | | | | 711/128 |
| 2023/0315299 A1* | 10/2023 | Qureshi | ............... | G06F 3/0614 |
| 2023/0315320 A1* | 10/2023 | SeyedzadehDelcheh | .................... | |
| | | | | G06F 3/0604 |
| | | | | 711/154 |

(Continued)

*Primary Examiner* — Mohamed M Gebril
(74) *Attorney, Agent, or Firm* — Colby Nipper PLLC

(57)                ABSTRACT

Apparatuses and techniques are described implementing power-efficient monitoring for usage-based-disturbance mitigation. In a first aspect, a memory device takes a less strict approach for monitoring worse-case conditions associated with usage-based disturbance. In particular, the memory device conserves power by foregoing updating a list of rows associated with worse-case conditions until an unlisted row has a substantially worse condition than any one of the listed rows. This decreases how often the memory device expends power to update the list. In an optional second aspect, the memory device performs a partial bit-width comparison operation to evaluate the "substantially worse" criterion. The partial bit-width comparison enables a comparator to be implemented with a smaller footprint and operate with less power as compared to a comparator that is capable of performing a full bit-width comparison operation.

20 Claims, 10 Drawing Sheets

(56) References Cited

U.S. PATENT DOCUMENTS

| | | | |
|---|---|---|---|
| 2023/0395120 A1* | 12/2023 | Ayyapureddi | G11C 11/40622 |
| 2024/0071459 A1* | 2/2024 | Confalonieri | G11C 11/406 |
| 2024/0146803 A1* | 5/2024 | Xu | H04L 47/2416 |
| 2024/0185910 A1* | 6/2024 | Devaux | G11C 11/40615 |
| 2024/0304234 A1* | 9/2024 | You | G06F 12/0246 |
| 2024/0312508 A1* | 9/2024 | Van Der Veen | |
| | | | G11C 11/40611 |
| 2024/0427497 A1* | 12/2024 | Lu | G06F 3/0673 |
| 2024/0428842 A1* | 12/2024 | Lu | G11C 11/4076 |
| 2025/0045388 A1* | 2/2025 | Eckel | G06F 21/554 |
| 2025/0131973 A1* | 4/2025 | Lu | G11C 29/52 |
| 2025/0157567 A1* | 5/2025 | Jin | G11C 29/76 |
| 2026/0029925 A1* | 1/2026 | Lu | G06F 3/0619 |

* cited by examiner

Bank Group
408

Banks
410-1 to 410-B

Die
404

Bank Group
408-G

Bank Group
408-1

UBD Circuit
120

Memory Module
402

Die
404-D

Die
404-3

Die
404-2

Die
404-1

Electrical Contacts   406

108

| Condition | Update Queue Flag 606 |
|---|---|
| Updated Count 602 > Activation Count 308 + Threshold 702 | 1 |
| Updated Count 602 ≤ Activation Count 302 + Threshold 702 | 0 |

704⟋

| Condition | Update Queue Flag 606 |
|---|---|
| First Set of MSBs 806 > Second set of MSBs 808 | 1 |
| First Set of MSBs 806 ≤ Second set of MSBs 808 | 0 |

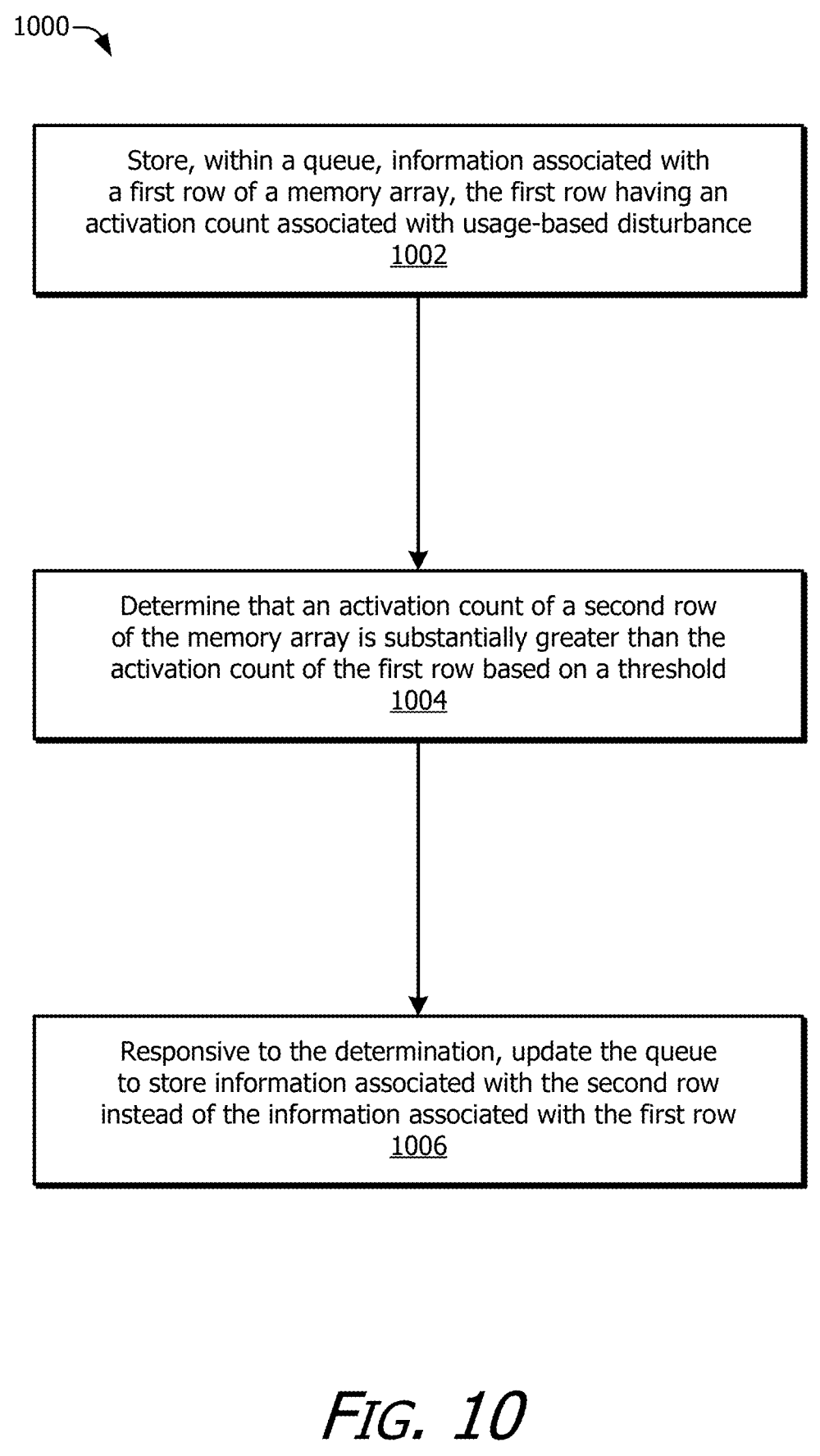

1000 ⟍

```
┌──────────────────────────────────────────────────┐
│   Store, within a queue, information associated with │
│   a first row of a memory array, the first row having an │
│   activation count associated with usage-based disturbance │
│                         1002                          │
└──────────────────────────────────────────────────┘
```

```
┌──────────────────────────────────────────────────┐
│   Determine that an activation count of a second row │
│   of the memory array is substantially greater than the │
│   activation count of the first row based on a threshold │
│                         1004                          │
└──────────────────────────────────────────────────┘
```

```
┌──────────────────────────────────────────────────┐
│   Responsive to the determination, update the queue │
│   to store information associated with the second row │
│   instead of the information associated with the first row │
│                         1006                          │
└──────────────────────────────────────────────────┘
```

FIG. 10

POWER-EFFICIENT MONITORING FOR USAGE-BASED-DISTURBANCE MITIGATION

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non- volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques implementing power-efficient monitoring for usage-based-disturbance mitigation are described with reference to the following drawings. The same numbers are used throughout the drawings to reference like features and components:

FIG. 1 illustrates example apparatuses that can implement aspects of power-efficient monitoring for usage-based-disturbance mitigation;

FIG. 3 illustrates example data stored within rows of a memory array;

FIG. 10 illustrates an example method for implementing aspects of local-bank-level scheduling of usage-based-disturbance mitigation strategies based on global-bank-level control.

DETAILED DESCRIPTION

Overview

Figure 2:
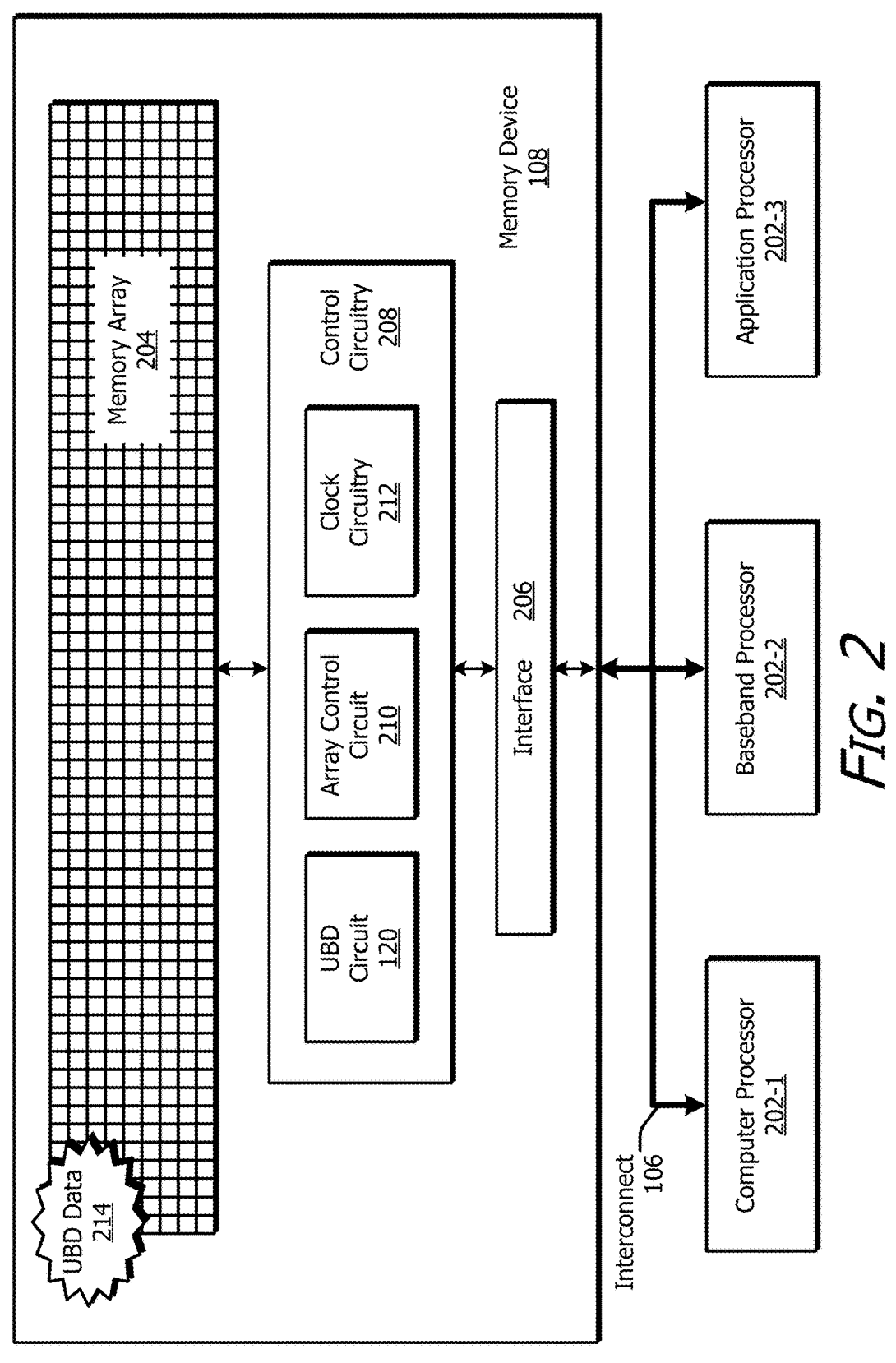
FIG. 2 illustrates an example computing system that can implement aspects of power-efficient monitoring for usage-based-disturbance mitigation.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller memories, memory devices can be designed with higher chip densities. Increasing chip density, however, can increase the electromagnetic coupling (e.g., capacitive coupling) between adjacent or proximate rows of memory cells due, at least in part, to a shrinking distance between these rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1." In this example, the voltage fluctuation can cause a sense amplifier to incorrectly determine the state of the memory cell to be a "0" instead of a "1." Left unchecked, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in a proximate row (e.g., within an R+1 row, an R+2 row, an R−1 row, and/or an R−2 row) to change states. This effect is referred to as usage-based disturbance. The occurrence of usage-based disturbance can lead to the corruption or changing of contents within the affected row of memory.

To monitor for usage-based disturbance, a memory device may identify rows having a condition associated with usage-based disturbance and prioritize refreshing proximate, including adjacent, victim rows to mitigate the usage-based disturbance. In some cases, the memory device is limited in the quantity of rows it can monitor at a given time. Some memory devices may use the limited memory to keep track of the rows with the worse conditions. To assemble and update this list of rows, the memory device compares the conditions between a listed row and a non-listed row to determine which one is worse. The row identified as having the worse condition is stored in the list and its corresponding victim rows can be refreshed once resources are available.

Monitoring for the worse condition, however, has several drawbacks. In a first issue, certain types of malicious attacks can cause the memory device to update the list of rows frequently. Consider a waterfall event, which involves activating a set of rows multiple times. The repeated manner in which this set of rows is activated can cause the worse-case condition to change frequently amongst the rows within the set. In order to keep track of the worse-case condition, this means that the memory device has to frequently update the list of rows associated with the worse-case condition, which consumes power and time.

In a second issue, monitoring for the worse condition means that the memory device is implemented with a comparator that is capable of performing a full bit-width comparison operation. A physical size (or footprint) of this comparator and the amount of power it consumes during operation is dependent upon the quantity of bits it needs to operate on to perform the full bit-width comparison operation. Space constraints and/or power constraints of the memory device may therefore limit a design of the comparator and the types of information it can evaluate.

To address these and other issues regarding usage-based disturbance, this document describes techniques for implementing power-efficient monitoring for usage-based-disturbance mitigation. In a first aspect, a memory device takes a less strict approach for monitoring worse-case conditions associated with usage-based disturbance. In particular, the memory device conserves power by foregoing updating a list of rows associated with worse-case conditions until an unlisted row has a substantially worse condition than any one of the listed rows. This decreases how often the memory device expends power to update the list. The "substantially worse" criterion can be defined in such a manner as to improve a power efficiency of the memory device while achieving a target efficiency in mitigating usage-based disturbance. In an optional second aspect, the memory device performs a partial bit-width comparison operation to evaluate the "substantially worse" criterion. The partial bit-width comparison enables a comparator to be implemented with a smaller footprint and operate with less power as compared to a comparator that is capable of performing a full bit-width comparison operation.

Example Operating Environments

Figure 1:
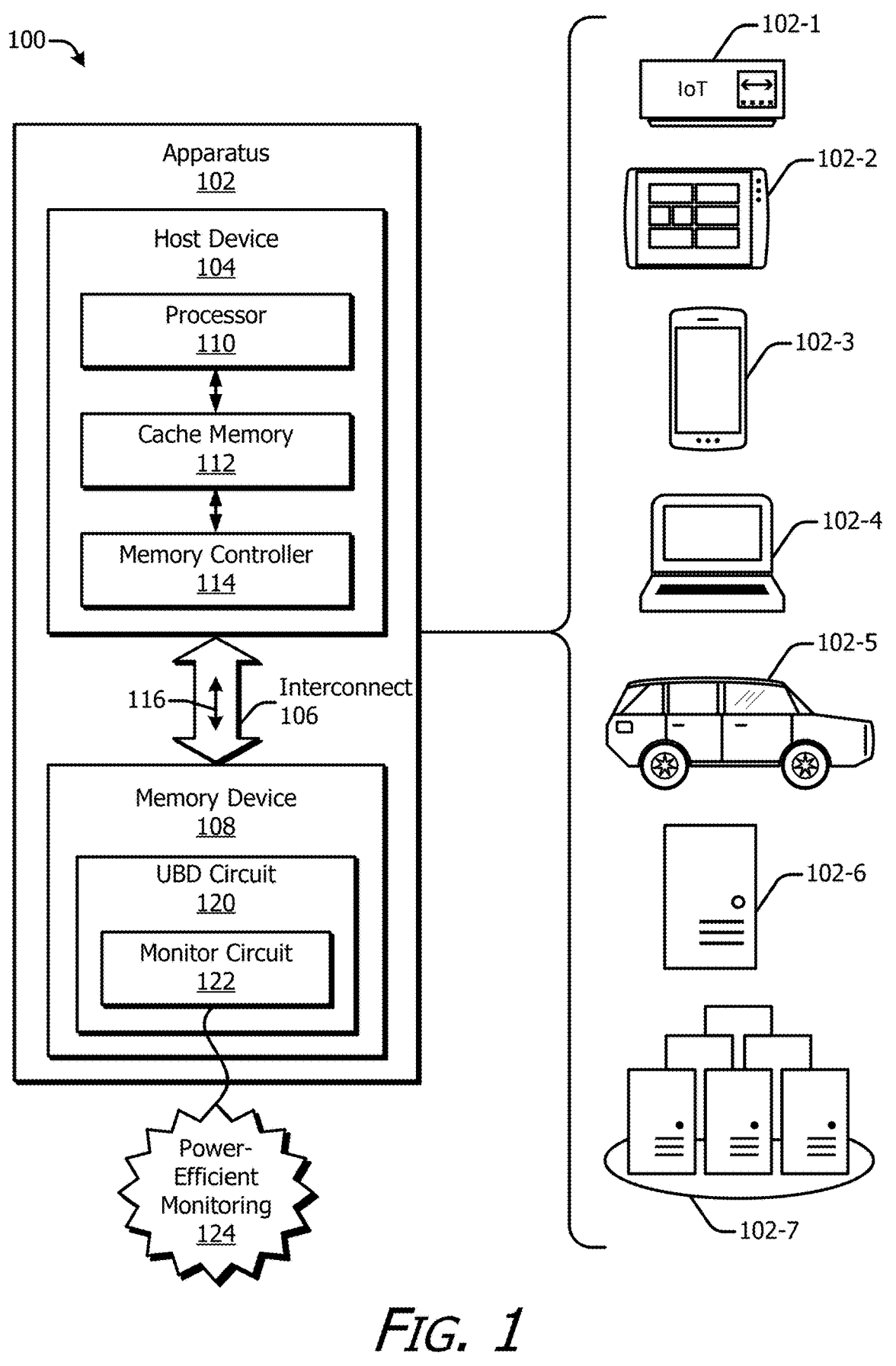

FIG. 1 illustrates, at 100 generally, an example operating environment including an apparatus 102 that can implement aspects of power-efficient monitoring for usage-based-disturbance mitigation. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes at least one instance of a usage-based-disturbance circuit 120 (UBD circuit 120). The usage-based-disturbance circuit 120 can each be implemented using software, firmware, hardware, fixed logic circuitry, or some combinations thereof.

The usage-based-disturbance circuit 120 mitigates usage-based disturbance for one or more banks associated with the memory device 108. This includes detecting a condition associated with usage-based disturbance and initiating a refresh of one or more victim rows associated with the detected condition. The usage-based-disturbance circuit 120 can employ various strategies for detecting and mitigating usage-based disturbance conditions. In example implementations, the usage-based-disturbance circuit 120 is implemented at a local-bank level (or a local level). This means that each instance of the usage-based-disturbance circuit 120 is associated with a particular bank or a particular set of banks. An example implementation of the usage-based-disturbance circuit 120 is further described with respect to FIG. 5.

The usage-based-disturbance circuit 120 includes at least one monitor circuit 122, which can perform one or more aspects of power-efficient monitoring 124. In a first aspect, the monitor circuit 122 conserves power by foregoing updating a list of rows associated with worse-case conditions until an unlisted row has a substantially worse condition than any one of the listed rows. This decreases how often the memory device 108 expends power to update the list. The "substantially worse" criterion can be defined in such a manner as to improve a power efficiency of the memory device 108 while achieving a target efficiency in mitigating usage-based disturbance. In examples described throughout, the substantially worse criterion can be applied to activation counts of the rows. Other examples are also possible in which the substantially worse criterion takes into account other characteristics associated with monitoring usage-based disturbance, such as parity errors, bit errors, how often a row is refreshed to mitigate usage-based disturbance, how often a neighboring row is refreshed due to mitigate usage-based disturbance, or some combination thereof.

In an optional second aspect, the monitor circuit 122 performs a partial bit-width comparison operation to evaluate the "substantially worse" criterion. The partial bit-width comparison enables a comparator to be implemented with a smaller footprint and operate with less power compared to a comparator capable of performing a full bit-width comparison operation. An example implementation of the monitor circuit 122 is further described with respect to FIG. 6. Other components of the memory device 108 are further described with respect to FIG. 2.

FIG. 2 illustrates an example computing system 200 that can implement aspects of power-efficient monitoring for usage-based-disturbance mitigation. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. In the depicted configuration, the control circuitry 208 includes the usage-based-disturbance circuit 120, at least one array control circuit 210, and at least one instance of clock circuitry 212. In some implementations, the usage-based-disturbance circuit 120 is part of the control circuitry 208, as shown in FIG. 2. In other implementations, the usage-based-disturbance circuit 120 is considered separate from the control circuitry 208.

The array control circuit 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality.

The usage-based-disturbance circuit 120 can be coupled to a set of memory cells within the memory array 204 that store usage-based-disturbance data 214 (UBD data 214). The usage-based-disturbance data 214 can include information such as an activation count, which represents a quantity of times one or more rows within the memory array 204 have been activated (or accessed) by the memory device 108. In example implementations, each row of the memory array 204 includes a subset of memory cells that stores the usage-based-disturbance data 214 associated with that row, as further described with respect to FIG. 3.

The interface 206 can couple the control circuitry 208 or the memory array 204 directly or indirectly to the interconnect 106. In some implementations, the usage-based-disturbance circuit 120, the array control circuit 210, and the clock circuitry 212 can be part of a single component (e.g., the control circuitry 208). In other implementations, one or more of the usage-based-disturbance circuit 120, the array control circuit 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi™, Bluetooth™, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). The memory array 204 is further described with respect to FIG. 3.

Figure 3:
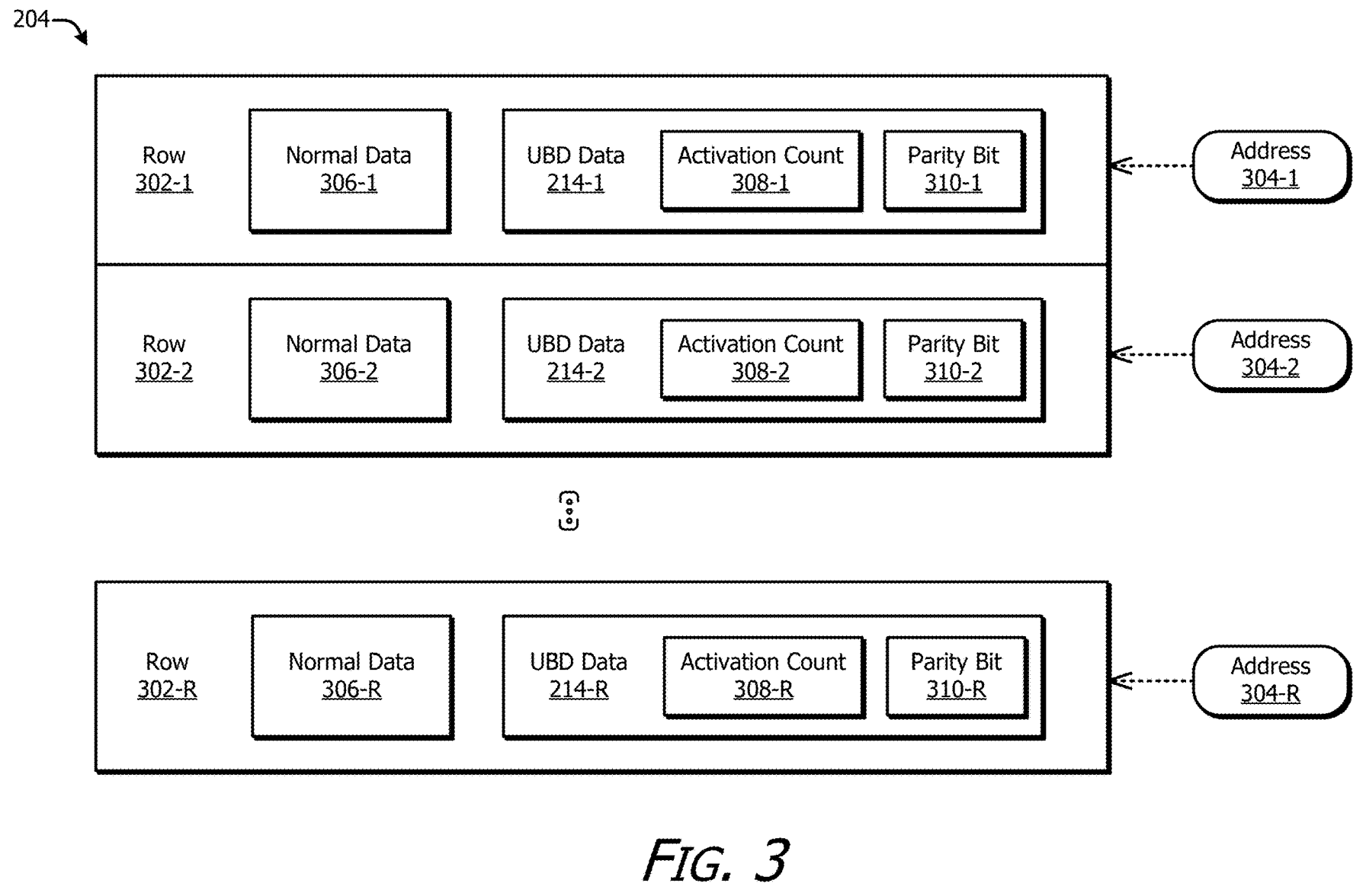

FIG. 3 illustrates example data stored within rows of the memory array 204. The memory array 204 includes multiple rows 302 of memory cells. For example, the memory array 204 depicted in FIG. 3 includes rows 302-1, 302-2 . . . 302-R, where R represents a positive integer. Each row 302 is associated with an address 304 (e.g., a row address, a memory row address, or a memory address). For example, the first row 302-1 has a first address 304-1, the second row 302-2 has a second address 304-2, and an Rih row 302-R has an $R^{th}$ address 304-R.

Each of the rows 302 can store normal data 306 within a first subset of the memory cells associated with that row 302. The normal data 306 represents data that is read from or written to the memory device 108 during normal memory operations (e.g., during normal read or write operations). The normal data 306, for example, can include data that is transmitted by the memory controller 114 and is written to one or more rows 302 of the memory array 204.

In addition to the normal data 306, each of the rows 302 can store usage-based-disturbance data 214 within a second subset of the memory cells associated with that row 302. The usage-based-disturbance data 214 includes information that enables the usage-based-disturbance circuit 120 to mitigate usage-based disturbance. In an example implementation, the usage-based-disturbance data 214 includes an activation count 308. With the activation count 308, the memory device 108 can keep track of a quantity of accesses or activations of the corresponding memory row 302. In some example implementations, the usage-based-disturbance data 214 can also include a count of how many times a neighboring row (e.g., an adjacent or a proximate row) is refreshed in order to mitigate usage-based disturbance. Each of these counts provide an example means by which the memory device 108 can monitor for usage-based disturbance and determine when to refresh victim rows to reduce the risk of usage-based disturbance corrupting data.

In the example shown in FIG. 3, the first row 302-1 stores first normal data 306-1 within a first subset of memory cells of the first row 302-1 and stores first usage-based-disturbance data 214-1 within a second subset of memory cells of the first row 302-1. The first usage-based-disturbance data 214-1 includes a first activation count 308-1, which represents a quantity of times the first row 302-1 has been activated since a last refresh. As another example, the second row 302-2 stores second normal data 306-2 within a first subset of memory cells within the second row 302-2 and stores second usage-based-disturbance data 214-2 within a second subset of memory cells within the second row 302-2. The second usage-based-disturbance data 214-2 includes a second activation count 308-2, which represents a quantity of times the second row 302-2 has been activated since a last refresh. Additionally, the $R^{th}$ row 302-R stores $R^{th}$ normal data 306-R within a first subset of memory cells within the $R^{th}$ row 302-R and stores $R^{th}$ usage-based-disturbance data 214-R within a second subset of memory cells within the $R^{th}$ row 302-R. The $R^{th}$ usage-based-disturbance data 214-R includes an $R^{th}$ activation count 308-R, which represents a quantity of times the $R^{th}$ row 302-R has been activated since a last refresh.

The usage-based-disturbance data 214 can also include information or can be formatted (e.g., coded) in such a way as to support error detection. In this example, the usage-based-disturbance data 214 includes a parity bit 310. In particular, the usage-based-disturbance data 214-1, 214-2, and 214-R respectively includes parity bits 310-1, 310-2, and 310-R. Other implementations are also possible in which the usage-based-disturbance data 214 is coded in a manner that supports any of the error detection tests described above, such as the error-correcting-code check. Although the techniques for detecting a condition associated with usage-based disturbance is generally described with respect to the activation count 308, these techniques can generally be applied to detecting a condition based on any type of information that is represented by the usage-based-disturbance data 214, including error detection techniques.

Example Techniques and Hardware

Figure 4:
FIG. 4 illustrates an example memory device in which aspects of power-efficient monitoring for usage-based-disturbance mitigation can be implemented.

FIG. 4 illustrates an example memory device 108 in which aspects of local-bank-level scheduling of usage-based-disturbance mitigation strategies based on global-bank-level control can be implemented. The memory device 108 includes a memory module 402, which can include multiple dies 404. As illustrated, the memory module 402 includes a first die 404-1, a second die 404-2, a third die 404-3, and a D^{th} die 404-D, with D representing a positive integer. The memory module 402 can be a SIMM or a DIMM. As another example, the memory module 402 can interface with other components via a bus interconnect (e.g., a Peripheral Component Interconnect Express (PCIe®) bus). The memory device 108 illustrated in FIGS. 1 and 2 can correspond, for example, to multiple dies (or dice) 404-1 through 404-D, or a memory module 402 with two or more dies 404. As shown, the memory module 402 can include one or more electrical contacts 406 (e.g., pins) to interface the memory module 402 to other components.

The memory module 402 can be implemented in various manners. For example, the memory module 402 may include a printed circuit board, and the multiple dies 404-1 through 404-D may be mounted or otherwise attached to the printed circuit board. The dies 404 (e.g., memory dies) may be arranged in a line or along two or more dimensions (e.g., forming a grid or array). The dies 404 may have a similar size or may have different sizes. Each die 404 may be similar to another die 404 or different in size, shape, data capacity, or control circuitries. The dies 404 may also be positioned on a single side or on multiple sides of the memory module 402.

One or more of the dies 404-1 to 404-D include the usage-based-disturbance circuit 120 and bank groups 408-1 to 408-G, with G representing a positive integer. Each bank group 408 includes at least two banks 410, such as banks 410-1 to 410-B, with B representing a positive integer. In some implementations, the die 404 includes multiple instances of the usage-based-disturbance circuit 120, which mitigate usage-based disturbance across at least one of the banks 410. For example, multiple instances of the usage-based-disturbance circuit 120 can respectively mitigate usage-based disturbance across the bank groups 408-1 to 408-G.

In other implementations, multiple instances of the usage-based-disturbance circuit 120 can respectively mitigate usage-based disturbance for respective banks 410. In this case, each usage-based-disturbance circuit 120 mitigates usage-based disturbance for a single bank 410 within one of the bank groups 408-1 to 408-B. In yet other example implementations, each usage-based-disturbance circuit 120 mitigates usage-based disturbance for a subset of the banks 410 associated with one of the bank groups 408-1 to 408-G, where the subset of the banks 410 includes at least two banks 410. An example implementation of the usage-based-disturbance circuit 120 is further described with respect to FIG. 5.

Figure 5:
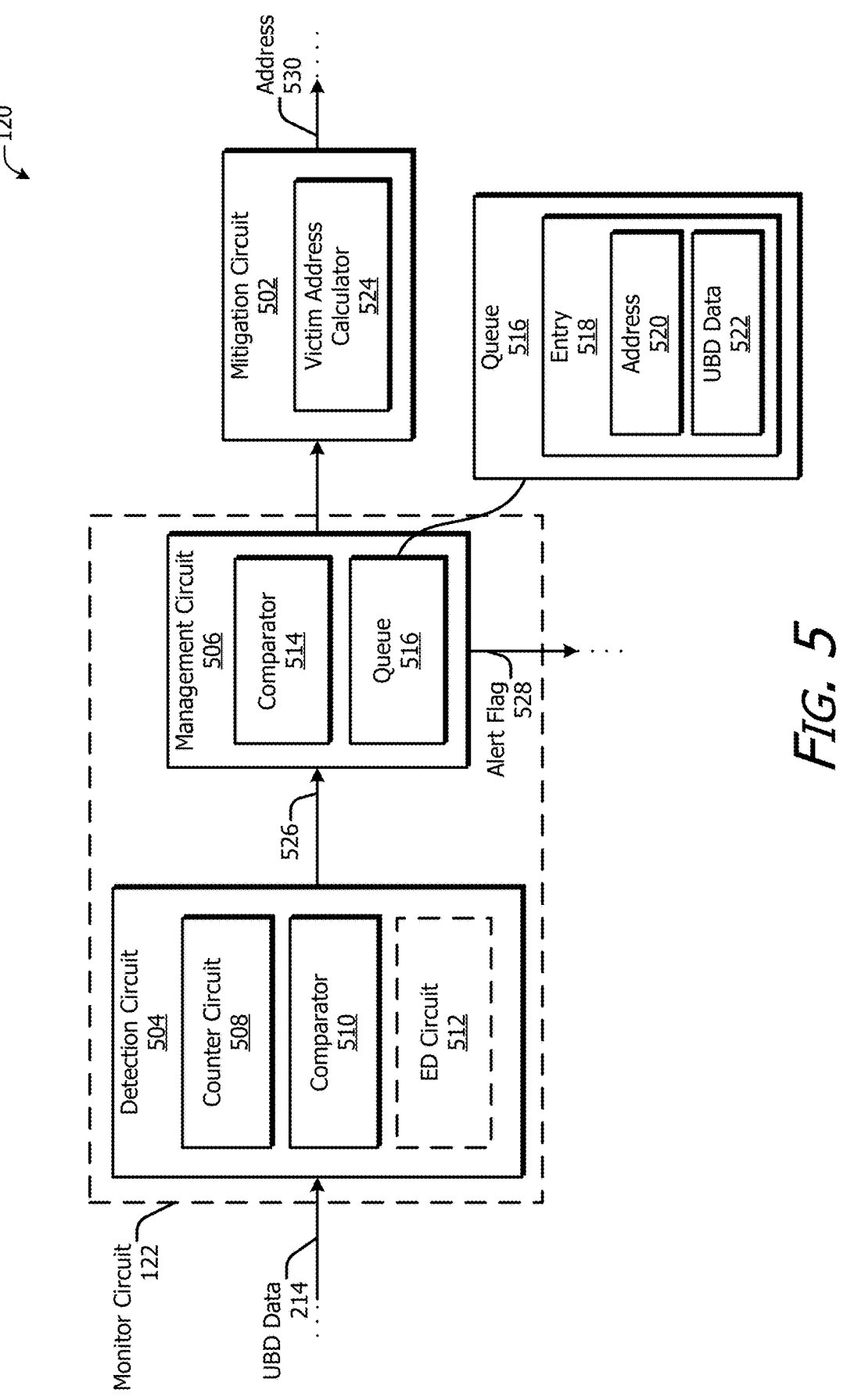
FIG. 5 illustrates an example implementation of a usage-based-disturbance circuit.

FIG. 5 illustrates an example implementation of the usage-based-disturbance circuit 120. In general, the usage-based-disturbance circuit 120 can detect one or more conditions that may lead to or indicate the presence of usage-based disturbance and mitigate its effects. To monitor for these conditions, the usage-based-disturbance circuit 120 maintains and updates the usage-based-disturbance data 214 that is stored in the memory array 204. If the usage-based-disturbance data 214 indicates that one of the conditions is present, then the related victim rows may be at increased risk for data corruption due to the usage-based-disturbance effect. To manage this risk, the usage-based-disturbance circuit 120 can support the refreshing of these victim rows.

In the depicted configuration, the usage-based-disturbance circuit 120 includes the monitor circuit 122 and at least one mitigation circuit 502. Although not explicitly shown, the monitor circuit 122 is coupled to the memory array 204. Through this coupling, the monitor circuit 122 can read the usage-based-disturbance data 214 associated with an activated row 302 and/or write updated usage-based-disturbance data 214 for the activated row 302. The mitigation circuit 502 is coupled between the monitor circuit 122 and other circuitry capable of performing a refresh, such as the control circuitry 208 or other refresh circuitry.

The monitor circuit 122 can detect a particular condition associated with usage-based disturbance and monitor the detected condition until it is mitigated. In some implementations, the usage-based-disturbance circuit 120 includes multiple monitor circuits 122, which detect different types of conditions associated with usage-based disturbance. The monitor circuit 122 includes at least one detection circuit 504 and at least one management circuit 506. The detection circuit 504 can be implemented using at least one counter circuit 508 and at least one comparator 510. The counter circuit 508 enables the detection circuit 504 to update the usage-based-disturbance data 214.

The detection circuit 504 can optionally include (or can optionally be coupled to) an error-detection circuit 512 (ED circuit 512). The error-detection circuit 512 can detect and/or correct bit errors associated with the usage-based-disturbance data 214. For example, the error-detection circuit 512 can perform a parity check based on the parity bit 310. The comparator 510, the error-detection circuit 512, or some combination thereof can be used to monitor for and detect one or more conditions associated with usage-based disturbance. Other techniques are also possible in which the usage-based-disturbance circuit 120 uses another type of analysis-type circuit to monitor for and detect a condition. Other analysis-type circuits, for example, can analyze the activation of other neighboring rows or determine how often a neighboring row is refreshed due to usage-based-disturbance mitigation techniques.

The management circuit 506 keeps track of instances of a detected condition that are to be mitigated once resources are available. In this example, the management circuit 506 includes at least one comparator 514 and at least one queue 516. The comparator 514 can perform a fuzzy-logic-type comparison to support power-efficient monitoring 124, as further described with respect to FIGS. 7 and 8.

The queue 516 can include one or more entries 518, which can store an address 520 of an aggressor row that is associated with an instance of the detected condition. In some cases, the entry 518 also includes usage-based-disturbance data 522 that is related to the detected condition, such as the activation count 308 of the aggressor row. The address 520 represents the address 304 of a previously activated row 302 and the usage-based-disturbance data 522 represents the usage-based-disturbance data 214 of the previously activated row 302.

The entries 518 within the queue 516 can be arranged and/or processed in a particular order, such as a first-in first-out (FIFO) order or a "worse case" order. In some cases, the priority-based order can be based on the activation count 308 such that higher-priority entries 518 have larger activation counts 308 compared to those of lower-priority entries 518. In an example implementation, the queue 516 is implemented using content-addressable memory (CAM) or a plurality of registers. A size of the queue 516 (e.g., a quantity of entries 518 that can be stored) can vary depending on the implementation. In an example, the queue 516 can store up to 3, 5, or 10 entries 518.

In some implementations, the management circuit 506 can also monitor for one or more alert conditions and inform other components of the memory device 108 of a detected alert condition. Example alert conditions can be based on a state of the queue 516 (e.g., a full state) or based on the usage-based-disturbance data 214. In an example implementation, the management circuit 506 determines whether an activation count 308 is greater than an alert threshold (e.g., determines whether the activation count 308 is approaching an intrinsic manufacturer limitation).

The mitigation circuit 502 initiates and/or performs an aspect of a mitigation procedure for a detected condition. An example mitigation procedure can include refreshing one or more rows 302 (e.g., one or more victim rows) that are impacted by the detected condition. It can also optionally include updating the usage-based-disturbance data 214, such as setting the usage-based-disturbance data 214 to a default state (e.g., setting the activation count 308 to a default value).

In this example, the mitigation circuit 502 includes at least one victim address calculator 524. The victim address calculator 524 identifies addresses of one or more victim rows that are to be refreshed based on an address 520 of an aggressor row. In some implementations, the victim rows that are determined by the victim address calculator 524 are based on the type of condition that is detected by the monitor circuit 122. In other implementations, an operation of the victim address calculator 524 can be controlled by the memory controller 114. In this case, the victim address calculator 524 can be coupled to a register (not shown). By setting an operand of the register, the memory controller 114 can cause the victim address calculator 524 to identify victim rows based on one or more different methods.

Consider an example in which the aggressor row is represented by row R. In a first example, the victim address calculator 524 identifies the one or more victim rows to include one or more rows 302 that are immediately adjacent to the aggressor row (e.g., the R+1 and/or R−1 rows). In a second example, the victim address calculator 524 identifies the one or more victim rows to include one or more rows 302 that are proximate to the aggressor row but not immediately adjacent to the aggressor row (e.g., the R+2, R−2, R+3, and/or R−3 rows 302 or some combination thereof). In a third example, the victim address calculator 524 identifies one or more adjacent rows and one or more proximate but non-adjacent rows.

During operation, the detection circuit 504 reads the usage-based-disturbance data 214 from the memory array for an activated row 302. The detection circuit 504 generates a condition flag 526 to indicate that a condition associated with usage-based disturbance is detected based on the usage-based-disturbance data 214. The management circuit 506 uses the comparator 514 to determine whether or not to store information about the detected condition in the queue 516.

As time progresses, the management circuit 506 may detect an alert condition. In this case, the management circuit 506 generates an alert flag 528 to indicate the presence of the alert condition. The alert flag 528 can cause the memory device 108 to perform an alert-backoff (ABO) procedure. As part of the alert-backoff procedure, the memory device 108 pauses normal operations (e.g., normal read and/or write procedures requested by the host device 104) for a recovery period during which refresh management commands or other functions may be performed in the memory device 108 to mitigate usage-based disturbance. During this recovery period, the victim rows associated with the alert condition are refreshed.

When a refresh command is issued and there are refresh pumps available for mitigating usage-based disturbance, the mitigation circuit 502 can accept information regarding an entry 518 from the management circuit 506. Based on the address 520 of the aggressor row that caused the condition, the victim address calculator 524 determines addresses 530 of the one or more victim rows that are to be refreshed. The mitigation circuit 502 provides the one or more addresses 530 of the victim rows to other circuitry that performs the refresh.

As described above, the usage-based-disturbance circuit 120 can monitor for and detect a condition associated with usage-based disturbance, keep track of the condition until resources are available to refresh the victim rows, and initiate the mitigation procedure by providing the addresses 530 of the victim tows that are to be refreshed. Other implementations of the usage-based-disturbance circuit 120 are also possible in which the usage-based-disturbance circuit 120 monitors and detects multiple types of conditions associated with usage-based disturbance. Example implementations of the detection circuit 504 and the management circuit 506 are further described with respect to FIG. 6.

Figure 6:
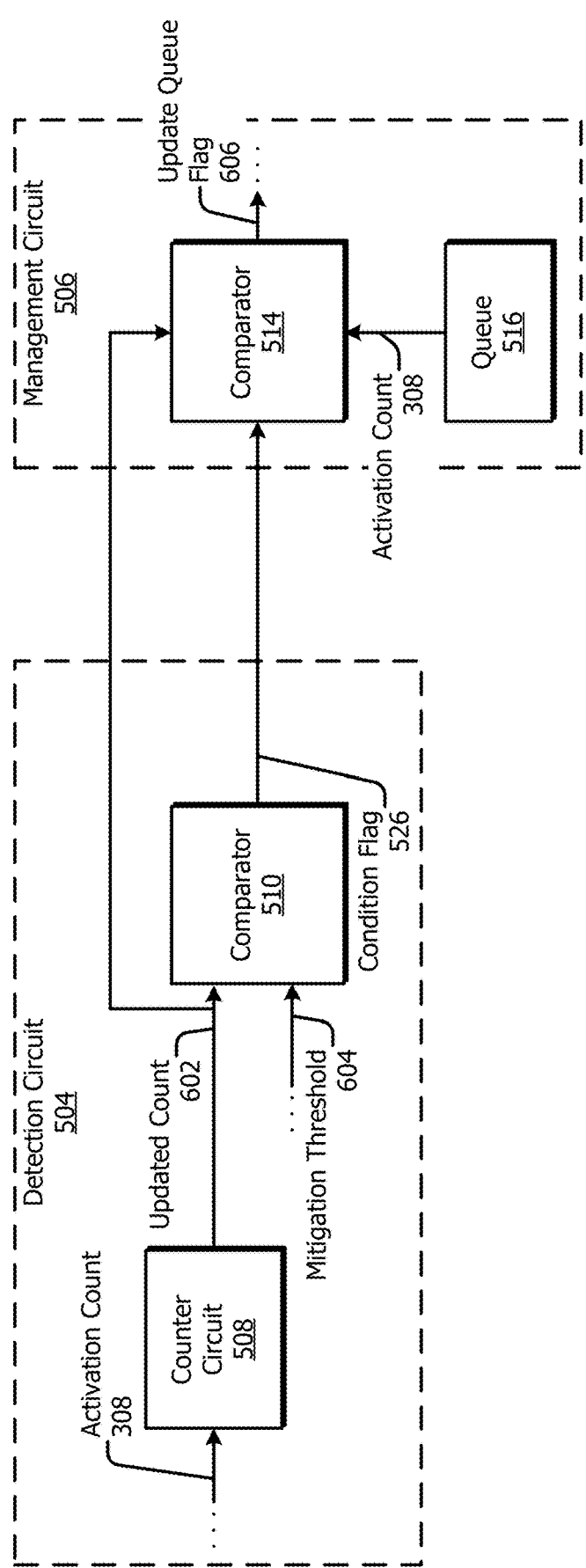
FIG. 6 illustrates an example implementation of a monitor circuit.

FIG. 6 illustrates an example implementation of the monitor circuit 122. In the depicted configuration, the counter circuit 508 and the comparator 510 of the detection circuit 504 are coupled to the comparator 514 of the management circuit 506. During operation, the memory device 108 activates a row 302. The monitor circuit 122 monitors the usage-based-disturbance data 214 associated with the activated row 302 to determine whether or not a condition associated with usage-based disturbance is present. Consider an example implementation in which the detection circuit 504 reads and updates the usage-based-disturbance data 214 associated with the activated row 302. The counter circuit 508, for instance, accepts the activation count 308 associated with the activated row 302 and increments the activation count 308 to generate an updated count 602. The detection circuit 504 writes the updated count 602 back to the usage-based-disturbance data 214 that is associated with the activated row 302.

In this example, the condition is associated with the activation count 308 meeting or exceeding a predetermined threshold. To monitor for the condition, the comparator 510 compares the updated count 602 to at least one mitigation threshold 604. If the updated count 602 is less than the mitigation threshold 604, the comparator 510 generates the condition flag 526 to indicate that the condition is not present. In this case, the management circuit 506 does not take any further action.

If the updated count 602 is greater than or equal to the mitigation threshold 604, the comparator 510 generates the condition flag 526 to indicate that the condition is present. In this case, the condition flag 526 causes the management circuit 506 to make a determination on whether or not to update the queue 516 in accordance with power-efficient monitoring 124. In particular, the management circuit 506 uses the comparator 514 to determine whether the condition associated with the activated row 302 is substantially worse than the condition associated with the one or more rows 302 that are listed within the queue 516. For example, the comparator 514 is enabled or placed in an active state based on the condition flag 526. Once enabled, the comparator 514 compares the updated count 602 with the activation count 308 of an entry 518 within the queue 516. If the updated count 602 is substantially worse than the activation count 308 of the entry 518, the comparator 514 generates an update queue flag 606 to cause the management circuit 506 to update the entry 518 within the queue 516 with the information associated with the activated row 302. Alternatively, if the updated count 602 is not substantially worse than the activation count 308 of the entry 518, the comparator 514 generates the update queue flag 606 to cause the management circuit 506 to take no further action. This means that the queue 516 is not updated and the entry 518 remains unchanged. This process can be repeated for all entries 518 within the queue 516 or until the non-listed row 302 is determined to have a substantially worse condition than a row 302 that is stored in one of the entries 518 within the queue 516.

There are various ways in which the comparator 514 can be implemented to evaluate the "substantially worse" criterion. In a first example implementation shown in FIG. 7, the comparator 514 performs a full bit-width comparison based on a threshold. In a second example implementation shown in FIG. 8, the comparator 514 performs a partial bit-width comparison to further improve power efficiency and to enable the comparator 514 to be implemented with a smaller footprint compared to the comparator 514 of FIG. 7. In this case, the "substantially worse" criterion is built into the quantity of most-significant bits that are evaluated (e.g., built into the quantity of least-significant bits that are ignored) as part of the partial bit-width comparison operation.

Figure 7:
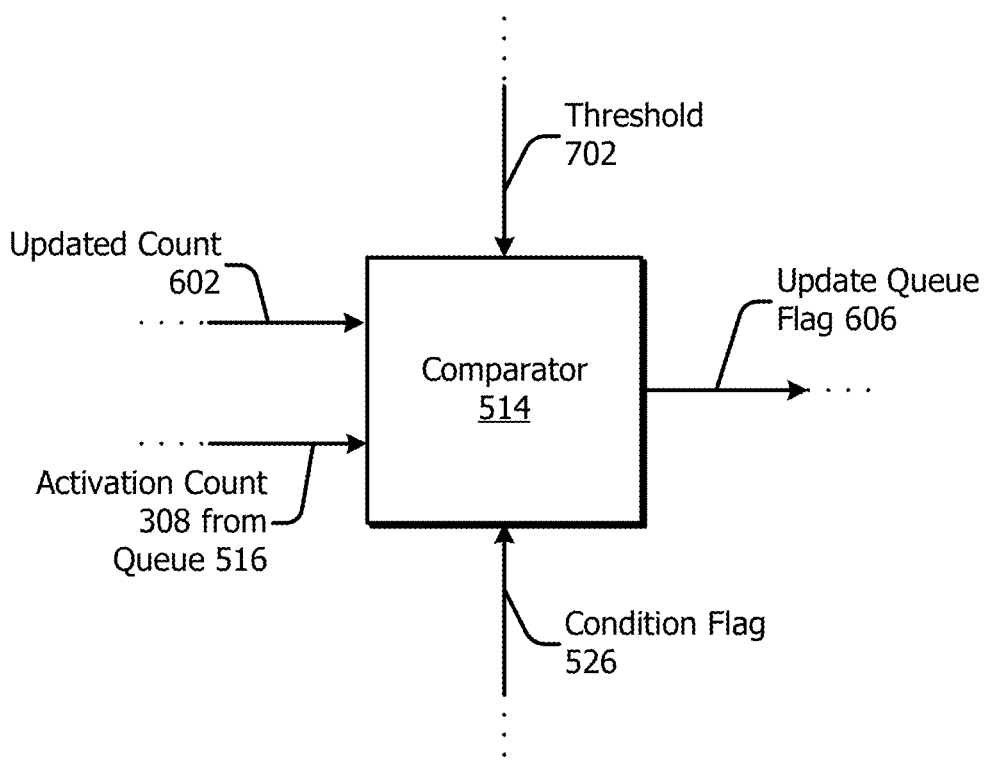
FIG. 7 illustrates a first example implementation of a comparator to implement aspects of power-efficient monitoring for usage-based-disturbance mitigation.

FIG. 7 illustrates a first example implementation of the comparator 514. In this example, the comparator 514 accepts the condition flag 526, which controls a state of the comparator 514 (e.g., causes the comparator 514 to be in an enabled state or a disabled state). The comparator 514 also accepts a threshold 702, which defines the "substantially worse" criterion. In general, a value of the threshold 702 is determined to improve the power efficiency of the monitor circuit 122 while enabling the usage-based-disturbance circuit 120 to meet efficiency requirements for mitigating usage-based disturbance. In example implementations, a summation of the threshold 702 and the mitigation threshold 604 is substantially less than an alert threshold for generating the alert flag 528. In this manner, the value of the threshold 702 is chosen such that the usage-based-disturbance circuit 120 is likely to mitigate the condition associated with usage-based disturbance prior to a row 302's activation count exceeding the intrinsic manufacturer limitation. Generally speaking, the threshold 702 represents a factor or a degree to which a condition is considered substantially worse than another condition.

In some implementations, a value of the threshold 702 is equal to a power of two. For example, the value of the threshold 702 can be greater than or equal to 2, 4, 8, 16, 32, 64, 128, and so forth. In this case, the power-efficiency of the comparator 514 can be further improved by implementing the comparator 514 of FIG. 8. Other example implementations are also possible. For example, the threshold 702 can be any value that is greater than or equal to one. In another case, the threshold 702 can be a random number that can vary between a minimum value and a maximum value.

During operation, the comparator 514 compares the updated count 602 to a summation of an activation count 308 from an entry 518 within the queue 516 and the threshold 702. A table 704 at the bottom of FIG. 7 depicts example logic values of the update queue flag 606 for different conditions. In the case that the updated count 602 is greater than the summation of the activation count 308 and the threshold 702, the comparator 514 sets the update queue flag 606 to a logic value of "1." This causes the management circuit 506 to update the queue 516 to replace the information of the evaluated entry 518 with the information associated with the unlisted (or activated) row 302. Alternatively, if the updated count 602 is less than or equal to the summation of the activation count 308 and the threshold 702, the comparator 514 sets the update queue flag 606 to a logic value of "0." This causes the management circuit 506 to take no further action and means that the entry 518 within the queue 516 remains the same (e.g., is not changed).

Figure 8:
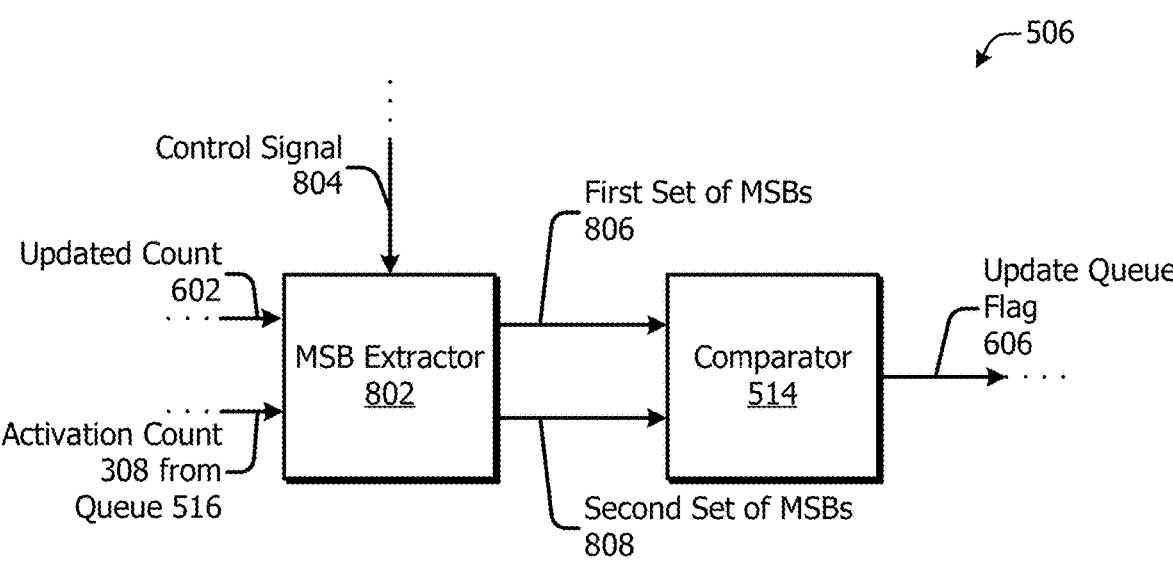
FIG. 8 illustrates a second example implementation of a comparator to implement aspects of power-efficient monitoring for usage-based-disturbance mitigation.

FIG. 8 illustrates a second example implementation of the comparator 514. In this case, the management circuit 506 includes a most-significant-bit extractor 802 (MSB extractor 802), which is coupled to or integrated within the comparator 514. The most-significant-bit extractor 802 accepts a control signal 804, which specifies the quantity of most-significant bits to be extracted. The control signal 804 is related to the threshold 702. For example, the threshold 702 is associated with a difference between a total quantity of bits associated with each of the updated count 602 and the activation count 308 and the quantity of most-significant bits that are extracted by the most-significant-bit extractor 802 for each of the updated count 602 and the activation count 308. More specifically, the quantity of least-significant bits that are removed by the most-significant-bit extractor 802 is equal to a base 2 logarithm of the threshold.

During operation, the most-significant-bit extractor 802 generates a first set of most-significant bits 806 based on the updated count 602 and the control signal 804. The most-significant-bit extractor 802 also generates a second set of most-significant bits 808 based on the activation count 308 from the queue 516 and the control signal 804. The quantity of bits within the first set of most-significant bits 806 is equal to the quantity of bits within the second set of most-significant bits 808. Although not explicitly shown in FIG. 8, states of the most-significant-bit extractor 802 and/or the comparator 514 can also be controlled by the condition flag 526, as described above with respect to FIG. 7.

Consider an example in which the updated count 602 and the activation count 308 from the queue 516 are each represented using 12 bits. In this example, a value of the threshold 702 is equal to 64. To effectively implement this "substantially worse" criterion, the control signal 804 causes the most-significant-bit extractor 802 to ignore the six least-significant bits (e.g., bits 0 through 5) and extract the six most-significant bits (e.g., bits 6 through 11) from the updated count 602 and from the activation count 308.

In this example, the comparator 514 performs a full bit-width comparison. However, since a subset of the bits from the updated count 602 and the activation count 308 are provided to the input, the comparator 514 of FIG. 8 can be implemented with a smaller footprint and can consume less power compared to the comparator 514 of FIG. 7. Due to the most-significant-bit extractor 802, the comparator 514 is essentially performing a partial bit-width comparison operation.

During operation, the comparator 514 compares the first set of most-significant bits 806 of the updated count 602 to the second set of most-significant bits 808 of the activation count 308. A table 810 at the bottom of FIG. 8 depicts example logic values of the update queue flag 606 for different conditions. In the case that the first set of most-significant bits 806 is greater than the second set of most-significant bits 808, the comparator 514 sets the update queue flag 606 to a logic value of "1." This causes the management circuit 506 to update the queue 516 to replace the information of the evaluated entry 518 with the information associated with the unlisted (or activated) row 302. Alternatively, if the first set of most-significant bits 806 is less than or equal to the second set of most-significant bits 808, the comparator 514 sets the update queue flag 606 to a logic value of "0." This causes the management circuit 506 to take no further action and means that the entry 518 within the queue 516 remains the same (e.g., is not changed). An example flow chart of this process is further described with respect to FIG. 9.

Figure 9:
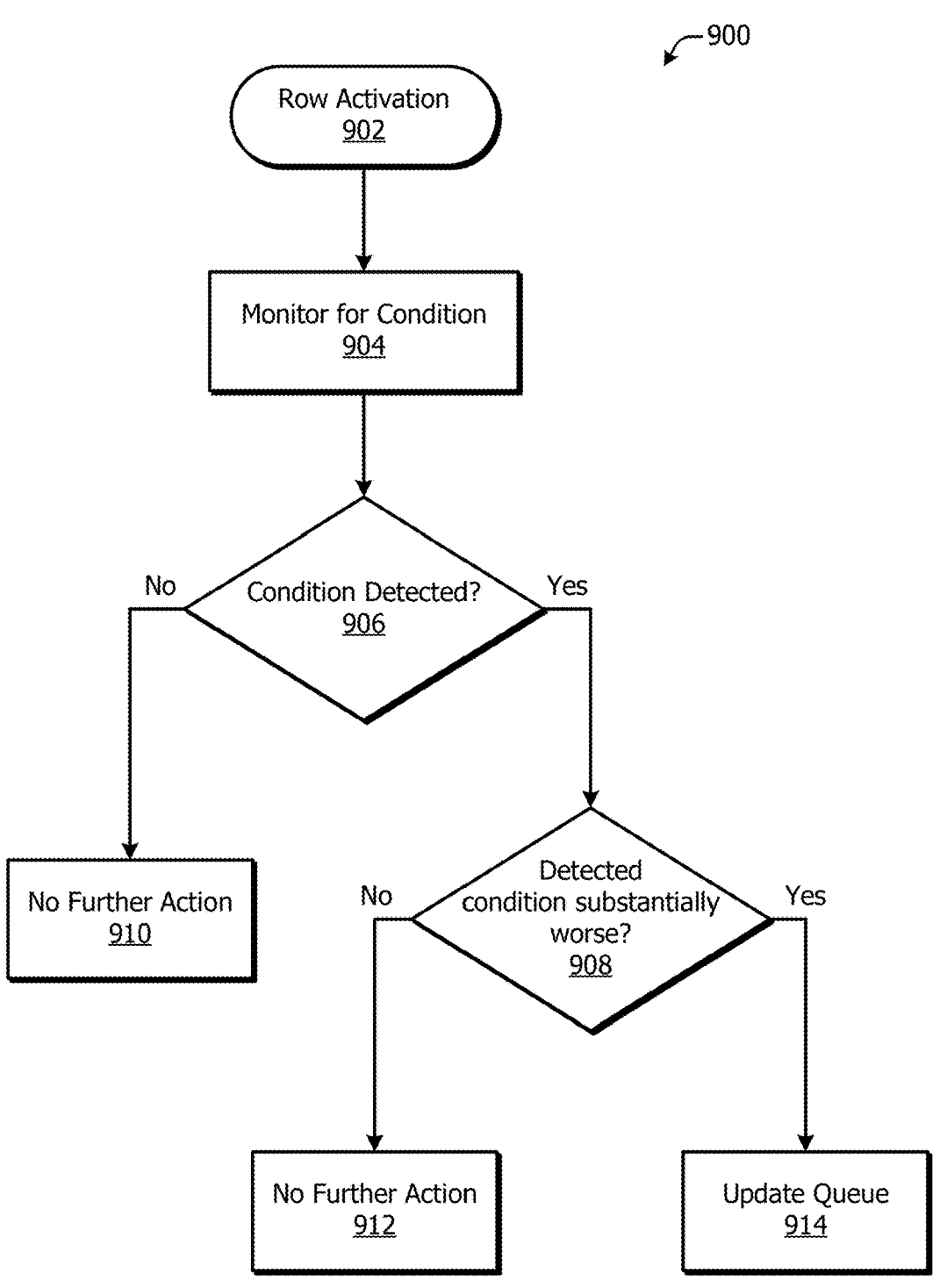
FIG. 9 illustrates an example scheme performed by a usage-based-disturbance circuit for power-efficient monitoring.

FIG. 9 illustrates an example scheme 900 implemented, at least in part, by the usage-based-disturbance circuit 120. At 902, a row 302 is activated. For example, the memory device 108 activates a row 302 within one of the banks 410 to perform a normal read operation or a normal write operation.

At 904, the usage-based-disturbance circuit 120 monitors for a condition associated with usage-based disturbance. An example operation can include reading the usage-based-disturbance data 214 from the bank 410, updating the usage-based-disturbance data 214, and writing the updated usage-based-disturbance data 214 back to the bank 410. In particular, the operation can include the array counter update (ACU) procedure. The array counter update procedure enables the usage-based-disturbance circuit 120 to keep track of how often a row is activated or accessed since a last refresh. As part of the array counter update procedure, the usage-based-disturbance circuit 120 updates the activation count 308 associated with an activated row 302. More specifically, the usage-based-disturbance circuit 120 reads the activation count 308 that is stored within the activated row 302, increments the activation count 308 using the counter circuit 508 to generate the updated count 602, and writes the updated count 602 back to the activated row 302.

At 906, the usage-based-disturbance circuit 120 determines if (e.g., whether or not) a condition associated with usage-based disturbance is detected. For example, the detection circuit 504 can compare the updated count 602 of the activated row 302 to the mitigation threshold 604, as shown in FIG. 6. If the updated count 602 is greater than or equal to the mitigation threshold 604, the usage-based-disturbance circuit 120 detects the condition and proceeds to step 908. Otherwise, if the updated count 602 is less than the mitigation threshold 604, the usage-based-disturbance circuit 120 takes no further action at 910.

At 908, the usage-based-disturbance circuit 120 determines if the detected condition is substantially worse than a condition that is listed in an entry 518 of the queue 516. If the detected condition is substantially worse, the management circuit 506 updates the entry 518 of the queue 516 with information associated with the activated row 302, as indicated at 914. This effectively replaces the information of a previously-listed row with the information associated with the active row. Otherwise, the management circuit 506 conserves power by taking no further action at 912 (e.g., by not updating the queue 516).

Once resources are available, the usage-based-disturbance circuit 120 performs some action associated with the mitigation procedure and based on the one or more rows 302 listed in the queue 516. In an example implementation, the mitigation circuit 502 determines addresses 530 of the victim rows based on the one or more addresses 520 of aggressor rows that are listed in the queue 516. The memory device 108 proceeds with refreshing the victim rows specified by the addresses 530.

Example Method

This section describes an example method for implementing aspects of power-efficient monitoring for usage-based-disturbance mitigation with reference to the flow diagram of FIG. 10. These descriptions may also refer to components, entities, and other aspects depicted in FIGS. 1 to 9 by way of example only. The described method is not necessarily limited to performance by one entity or multiple entities operating on one device.

FIG. 10 illustrates a method 1000, which includes operations 1002 through 1006. In aspects, operations of the method 1000 are implemented by a memory device 108 as described with reference to FIG. 1. In particular, the operations of the method 1000 are performed by the monitor circuit 122 of FIG. 1. At 1002, information associated with a first row of a memory array are stored within a queue. The first row has an activation count associated with usage-based disturbance. For example, the queue 516 stores information associated with the first row 302-1 of the memory array 204, as shown in FIG. 5. Example types of information include an address 520 of the first row 302-1 and/or the usage-based-disturbance data 522 associated with the first row 302-1. In this case, the first row 302-1 represents an aggressor row, which has a condition associated with usage-based disturbance. For example, the first row 302-1 can have an activation count 308 that is greater than the mitigation threshold 604.

The detection circuit 504 detects the condition associated with usage-based disturbance for the second row 302-2 of the memory array 204. In particular, the detection circuit 504 determines that the updated count 602 of the second row 302-2 is greater than the mitigation threshold 604. This means that the second row 302-2 is also identified as an aggressor row. The second row 302-2 is different than the first row 302-1.

At 1004, it is determined that an activation count of the second row of the memory array is substantially greater than the activation count of the first row based on a threshold. For example, the management circuit 506 determines that the condition associated with the second row 302-2 is substantially worse than the condition associated with the first row 302-1. In a first example implementation, this means that the comparator 514 determines that the updated count 602 of the second row 302-2 is greater than a summation of the activation count 308 of the first row 302-1 and the threshold 702, as shown in FIG. 7. In a second example implementation, this means that the comparator 514 determines that the first set of most-significant bits 806 of the updated count 602 is greater than the second set of most-significant bits 808 of the activation count 308 of the first row 302-1, as shown in FIG. 8.

At 1006, the queue is updated to store information associated with the second row instead of the information associated with the first row responsive to the determination. For example, the comparator 514 generates the update queue flag 606, which causes the management circuit 506 to update the entry 518 within the queue 516 to include the information associated with the second row 302-2 instead of the information associated with the first row 302-1. More specifically, this means that the queue 516 can be updated to store the address 520 and/or the usage-based-disturbance data 522 (e.g., the updated count 602) associated with the second row 302-2.

By waiting to update the queue 516 until an unlisted row 302's condition is substantially worse than the condition associated with an entry 518 within the queue 516, the usage-based-disturbance circuit 120 can improve a power efficiency of the memory device 108 and reduce an impact of a malicious attack, such as a waterfall event, in draining the power resources of the memory device 108. In some implementations, the usage-based-disturbance circuit 120 is implemented in such a way as to perform a partial bit-width comparison operation to determine the "substantially worse" criterion, which can further save power and area.

For the figure described above, the order in which operations are shown and/or described are not intended to be construed as a limitation. Any number or combination of the described process operations can be combined or rearranged in any order to implement a given method or an alternative method. Operations may also be omitted from or added to the described method. Further, described operations can be implemented in fully or partially overlapping manners.

Aspects of these methods may be implemented in, for example, hardware (e.g., fixed-circuit circuitry or a processor in conjunction with a memory), firmware, software, or some combination thereof. The method may be realized using one or more of the apparatuses or components shown in FIGS. 1 to 9, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of power-efficient monitoring for usage-based-disturbance mitigation are described:

Example 1: A method comprising:
    storing, within a queue, information associated with a first row of a memory array, the first row having an activation count associated with usage-based disturbance;
    determining that an activation count of a second row of the memory array is substantially greater than the activation count of the first row based on a threshold; and
    responsive to the determination, updating the queue to store information associated with the second row instead of the information associated with the first row.

Example 2: The method of example 1 or any other example, wherein:
    the storing of the information associated with the first row comprises storing the activation count of the first row; and
    the determining that the activation count of the second row is substantially greater comprises determining that the activation count of the second row is greater than a summation of the activation count of the first row and a threshold.

Example 3: The method of example 1 or any other example, wherein a value of the threshold is equal to a power of two.

Example 4: The method of example 3 or any other example, wherein the value of the threshold is greater than or equal to 32.

Example 5: The method of example 4 or any other example, wherein the value of the threshold is greater than or equal to 64.

Example 6: The method of example 3 or any other example, wherein the determining that the activation count of the second row is substantially greater comprises performing a partial bit-width comparison between the activation count of the first row and the activation count of the second row.

Example 7: The method of example 6 or any other example, wherein the performing of the partial bit-width comparison comprises:
    comparing a first set of most-significant bits associated with the activation count of the first row to a second set of most-significant bits associated with the activation count of the second row, the first set and the second set having a same quantity of bits; and
    determining that the second set of most-significant bits is greater than the first set of most-significant bits.

Example 8: The method of example 7 or any other example, wherein:
    the activation count of the first row and the activation count of the second row each comprise a first quantity of bits;
    the first set of most-significant bits and the second set of most-significant bits each comprise a second quantity of bits; and
    the threshold is associated with a difference between the first quantity of bits and the second quantity of bits.

Example 9: The method of example 1 or any other example, further comprising:
    determining that an activation count of a third row of the memory array is not substantially greater than the activation count of the second row based on the threshold; and
    responsive to the determination that the activation count of the third row is not substantially greater, continue storing, within the queue, the information associated with the second row.

Example 10: The method of example 9 or any other example, wherein the determining that the activation count of the third row is not substantially greater comprises one of the following:
    determining that the activation count of the third row is less than a summation of an activation count of the second row and the threshold; or
    determining that a third set of most-significant bits associated with the activation count of the third row is less than a second set of most-significant bits associated with the activation count of the second row.

Example 11: A memory device comprising:
a memory array comprising a first row and a second row;
a queue configured to store information associated with the first row, the first row having an activation count associated with usage-based disturbance; and
a circuit configured to:
determine that an activation count of the second row is substantially greater than the activation count of the first row based on a threshold; and
responsive to the determination, cause the queue to store information associated with the second row instead of the information associated with the first row.

Example 12: The memory device of example 11 or any other example, wherein the circuit comprises a comparator configured to determine that the activation count of the second row is greater than a summation of the activation count of the first row and the threshold.

Example 13: The memory device of example 11 or any other example, wherein a value of the threshold is equal to a power of two.

Example 14: The memory device of example 13 or any other example, wherein the circuit comprises a comparator configured to:
compare a first set of most-significant bits associated with the activation count of the first row to a second set of most-significant bits associated with the activation count of the second row, the first set and the second set having a same quantity of bits; and
determine that the second set of most-significant bits is greater than the first set of most- significant bits.

Example 15: The memory device of example 11 or any other example, wherein:
the memory array comprises a third row; and the circuit is configured to:
determine that an activation count of the third row is not substantially greater than the activation count of the second row based on the threshold; and
responsive to the determination that the activation count of the third row is not substantially worse, cause the queue to continue storing the information associated with the second row.

Example 16: The memory device of example 15 or any other example, wherein the circuit is configured to determine that the activation count of the third row is not substantially greater than the activation count of the second row based on one of the following:
a determination that the activation count of the third row is less than a summation of the activation count of the second row and the threshold; or
a determination that a third set of most-significant bits associated with the activation count of the third row is less than a second set of most-significant bits associated with the activation count of the second row.

Example 17: A memory device comprising:
a queue configured to store, within an entry of the queue, an activation count of a first row and an address of the first row, the activation count meeting a condition associated with usage-based disturbance; and
a comparator coupled to the queue and configured to:
compare the activation count of the first row with an activation count of an active row; and
responsive to the comparison indicating the activation count of the active row is substantially greater than the activation count of the first row, cause the queue to update the entry to store the activation count of the active row and an address of the active row; or
responsive to the comparison indicating the activation count of the active row is not substantially greater than the activation count of the first row, cause the queue to continue storing the activation count and the address of the first row.

Example 18: The memory device of example 17 or any other example, wherein the comparator is configured to determine that the activation count of the active row is greater than a summation of the activation count of the first row and a threshold.

Example 19: The memory device of example 18 or any other example, wherein a value of the threshold is equal to a power of two.

Example 20: The memory device of example 19 or any other example, wherein the comparator is configured to:
compare a first set of most-significant bits associated with the activation count of the first row to a second set of most-significant bits associated with the activation count of the active row, the first set and the second set having a same quantity of bits; and
determine that the second set of most-significant bits is greater than the first set of most-significant bits.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Conclusion

Although aspects of power-efficient monitoring for usage-based-disturbance mitigation have been described in language specific to certain features and/or methods, the subject of the appended claims is not necessarily limited to the specific features or methods described. Rather, the specific features and methods are disclosed as a variety of example implementations of power-efficient monitoring for usage-based-disturbance mitigation.

What is claimed is:
1. A method performed by a memory device, the method comprising:
storing, within a queue of the memory device, information corresponding to a first row of a memory array, the first row having an activation count that meets a condition for mitigating usage-based disturbance;
comparing a first set of most-significant bits corresponding to the activation count of the first row to a second set of most-significant bits corresponding to an activation count of a second row of the memory array, the first set and the second set having a same quantity of bits;
determining, based on the comparing, that the activation count of the second row is greater than the activation count of the first row by at least a threshold; and responsive to the determining, updating the queue to store information corresponding to the second row instead of the information corresponding to the first row.

2. The method of claim 1, wherein:

the storing of the information corresponding to the first row comprises storing the activation count of the first row; and the determining that the activation count of the second row is greater than the activation count of the first row by at least the threshold comprises determining that the activation count of the second row is greater than a summation of the activation count of the first row and the threshold.

3. The method of claim 2, wherein a value of the threshold is equal to a power of two.

4. The method of claim 3, wherein the value of the threshold is greater than or equal to 32.

5. The method of claim 4, wherein the value of the threshold is greater than or equal to 64.

6. The method of claim 3, wherein the determining that the activation count of the second row is greater than the activation count of the first row by at least a threshold comprises performing a partial bit-width comparison between the activation count of the first row and the activation count of the second row.

7. The method of claim 1, further comprising:

performing, based on the queue storing the information corresponding to the second row, one or more refresh operations to mitigate the usage-based disturbance associated with activation of the second row.

8. The method of claim 1, wherein:

the activation count of the first row and the activation count of the second row each comprise a first quantity of bits;

the first set of most-significant bits and the second set of most-significant bits each comprise a second quantity of bits; and a value of the threshold is determined based on a difference between the first quantity of bits and the second quantity of bits.

9. The method of claim 2, further comprising:

determining that an activation count of a third row of the memory array is not greater than the activation count of the second row by at least the threshold; and responsive to the determining that the activation count of the third row is not greater than the activation count of the second row by at least the threshold, continue storing, within the queue, the information corresponding to the second row.

10. The method of claim 9, wherein the determining that the activation count of the third row is not greater than the activation count of the second row by at least the threshold comprises one of the following:

determining that the activation count of the third row is less than a summation of the activation count of the second row and the threshold; or determining that a third set of most-significant bits corresponding to the activation count of the third row is less than a second set of most-significant bits corresponding to the activation count of the second row.

11. A memory device comprising:

a memory array comprising a first row and a second row;

a queue configured to store information corresponding to the first row, the first row having an activation count that meets a condition for mitigating usage-based disturbance; and a circuit configured to:

compare a first set of most-significant bits corresponding to the activation count of the first row to a second set of most-significant bits corresponding to an activation count of the second row, the first set and the second set having a same quantity of bits;

determine, based on the comparison, that the activation count of the second row is greater than the activation count of the first row by at least a threshold; and responsive to the determination, cause the queue to store information corresponding to the second row instead of the information corresponding to the first row.

12. The memory device of claim 11, wherein the circuit comprises a comparator configured to determine that the activation count of the second row is greater than a summation of the activation count of the first row and the threshold.

13. The memory device of claim 11, wherein a value of the threshold is equal to a power of two.

14. The memory device of claim 11, wherein the circuit is configured to:

cause, based on the queue storing the information corresponding to the second row, the memory device to perform one or more refresh operations to mitigate the usage-based disturbance associated with activation of the second row.

15. The memory device of claim 11, wherein:

the memory array comprises a third row; and the circuit is configured to:

determine that an activation count of the third row is not greater than the activation count of the second row by at least the threshold; and responsive to the determination that the activation count of the third row is not greater than the activation count of the second row by at least the threshold, cause the queue to continue storing the information corresponding to the second row.

16. The memory device of claim 15, wherein the circuit is configured to determine that the activation count of the third row is not greater than the activation count of the second row by at least the threshold based on one of the following:

a determination that the activation count of the third row is less than a summation of the activation count of the second row and the threshold; or a determination that a third set of most-significant bits corresponding to the activation count of the third row is less than a second set of most-significant bits corresponding to the activation count of the second row.

17. A memory device comprising:

a queue configured to store, within an entry of the queue, an activation count of a first row and an address of the first row, the activation count meeting a condition for mitigating usage-based disturbance; and a comparator coupled to the queue and configured to:

compare a first set of most-significant bits corresponding to the activation count of the first row to a second set of most-significant bits corresponding to an activation count of an active row, the first set and the second set having a same quantity of bits; and responsive to the comparison indicating the activation count of the active row is greater than the activation count of the first row by at least a threshold, cause the queue to update the entry to store the activation count of the active row and an address of the active row; or responsive to the comparison indicating the activation count of the active row is not greater than the activation count of the first row by at least the threshold, cause the queue to continue storing the activation count and the address of the first row.

18. The memory device of claim 17, wherein the comparator is configured to determine that the activation count of the active row is greater than a summation of the activation count of the first row and the threshold.

19. The memory device of claim 18, wherein a value of the threshold is equal to a power of two.

20. The memory device of claim 17, wherein the memory device is configured to:

perform, based on the queue storing the activation count of the active row, one or more refresh operations to mitigate the usage-based disturbance associated with activation of the active row; or perform, based on the queue storing the activation count of the first row, one or more other refresh operations to mitigate the usage-based disturbance associated with activation of the first row.

\* \* \* \* \*